(12) United States Patent
Otsuka et al.

(10) Patent No.: US 7,231,830 B2
(45) Date of Patent: Jun. 19, 2007

(54) PRESSURE SENSOR WITH PROCESSING CIRCUIT COVERED BY SENSOR CHIP

(75) Inventors: Kiyoshi Otsuka, Kariya (JP); Inao Toyoda, Anjo (JP)

(73) Assignee: DENSO Corporation, Kariya (JP)

( * ) Notice: Subject to any disclaimer, the term of this patent is extended or adjusted under 35 U.S.C. 154(b) by 8 days.

(21) Appl. No.: 11/218,548

(22) Filed: Sep. 6, 2005

(65) Prior Publication Data

US 2006/0075821 A1 Apr. 13, 2006

(30) Foreign Application Priority Data

Sep. 24, 2004 (JP) ............................. 2004-276771

(51) Int. Cl.
G01L 7/00 (2006.01)
(52) U.S. Cl. ....................................................... 73/756
(58) Field of Classification Search ................. 73/754, 73/756
See application file for complete search history.

(56) References Cited

U.S. PATENT DOCUMENTS

| 5,595,939 A | 1/1997 | Otake et al. | |
|---|---|---|---|
| 6,978,681 B2 * | 12/2005 | Sasaki et al. | 73/756 |
| 2003/0070490 A1 * | 4/2003 | Yamakawa | 73/754 |
| 2005/0011273 A1 * | 1/2005 | Sasaki et al. | 73/756 |
| 2005/0132873 A1 * | 6/2005 | Diaz Supisiche et al. | 89/36.01 |
| 2005/0193825 A1 * | 9/2005 | Otsuka | 73/715 |
| 2006/0053896 A1 * | 3/2006 | Suzuki | 73/756 |

FOREIGN PATENT DOCUMENTS

JP A-2003-302300 10/2003

* cited by examiner

Primary Examiner—Andre J. Allen
(74) Attorney, Agent, or Firm—Posz Law Group, PLC

(57) ABSTRACT

A pressure sensor includes a connector case having a recess, in which a sensor chip is contained and an oil is filled. The recess filled with the oil is sealed by a metal diaphragm. The sensor chip for outputting signals and the circuit chip having a processing circuit for processing the signals from the sensor chip, are stacked. That is, the circuit chip is provided between a bottom wall surface of the recess and the sensor chip. The processing circuit is covered by at least a part of the sensor chip, and the processing circuit of the circuit chip is arranged at a place where the processing circuit can avoid contact with the oil. Because the processing circuit of the circuit chip is not exposed to the oil, the processing circuit can be effectively restricted from being charged due to a polarization of the oil.

15 Claims, 10 Drawing Sheets

PRESSURE SENSOR WITH PROCESSING CIRCUIT COVERED BY SENSOR CHIP

CROSS REFERENCE TO RELATED APPLICATION

This application is based on Japanese Patent Application No. 2004-276771 filed on Sep. 24, 2004, the contents of which are incorporated herein by reference in its entirety.

FIELD OF THE INVENTION

The present invention relates to a pressure sensor, in which a processing circuit of a circuit chip is protected from being exposed to an oil filled in a pressure detection chamber sealed with a metal diaphragm.

BACKGROUND OF THE INVENTION

A conventional liquid-sealed diaphragm type pressure sensor includes a case having a recess on one side thereof, a sensor chip contained in the recess for pressure detection, an oil filled in the recess and a metal diaphragm for sealing the recess (e.g. U.S. Pat. No. 5,595,939, which is corresponding to JP-A-7-243926).

In this conventional pressure sensor, the recess is filled with the oil, which is used as a pressure transmitting medium and is sealed by the metal diaphragm, so that this oil filled space constitutes a pressure detecting chamber. The sensor chip is contained within the pressure detection chamber.

When the pressure is applied to the metal diaphragm, the diaphragm deforms and the pressure is transmitted to the sensor chip via the oil. The sensor chip outputs a signal of a corresponding level in accordance with the applied pressure so that the pressure is detected.

However, when more than several hundreds of high voltage is applied to this pressure sensor, the same high voltage is also applied to the metal diaphragm. Therefore, the oil is polarized and the sensor chip within the oil is charged.

In the conventional pressure sensor, an integrated sensor chip having a stress gauge and a processing circuit for processing (amplifying or controlling) signals is used. Therefore, when the sensor chip is charged by the oil, the processing circuit for processing the signals is also charged. As a result, an error output is caused from the sensor due to an abnormal operation of the processing circuit.

SUMMARY OF THE INVENTION

In view of the above-described problems, it is an object of the present invention to provide a pressure sensor, in which a processing circuit of a circuit chip is located to avoid a contact with an oil filled in a recess formed in a connector case. In the pressure sensor, charging to the processing circuit due to a polarization of the oil is effectively restricted.

According to an aspect of the present invention, a pressure sensor includes a connector case having a recess recessed from one surface, a sensor chip contained in the recess for detecting a pressure, a circuit chip having a processing circuit for processing a signal from the sensor chip, an oil filled in the recess, and a metal diaphragm which closes and seals the recess filled with the oil. In the pressure sensor, the circuit chip is stacked with the sensor chip, and the processing circuit is arranged to avoid a contact with the oil. Because the processing circuit does not contact the oil, it can prevent the processing circuit from being charged due to a polarization of the oil.

As an example, the sensor chip can be fixed to the processing circuit through an adhesive material, and the adhesive material is arranged to include a region where the processing circuit is placed. Therefore, the sensor chip prevents the processing circuit from being directly exposed to the oil. Specifically, the processing circuit is covered at least by a part of the sensor chip stacked therewith. In this case, the circuit chip can be arranged on a bottom wall surface of the recess, and the sensor chip is located above the circuit chip.

The sensor chip can be stacked with the circuit chip through a glass pedestal. In this case, the sensor chip and the circuit chip can be electrically connected by a bonding wire. Alternatively, the sensor chip and the circuit chip are connected through a conductive connecting member having an electric conductivity, a ground pad with a ground potential is formed on the circuit chip, and the ground pad and the conductive connecting member are electrically connected.

According to another aspect of the present invention, a pressure sensor includes a connector case having a recess recessed from one surface, a sensor chip located in the recess for detecting a pressure, an oil filled in the recess, a metal diaphragm which closes and seals the recess filled with the oil, a circuit chip having a processing circuit for processing a signal from the sensor chip, and a terminal pin, provided in the connector case. The processing circuit is electrically connected to an exterior through the terminal pin, the circuit chip is located in the connector case at a position separated from the recess, and the sensor chip is electrically connected to the circuit chip through the terminal pin. Because the circuit chip is located in the connector case to be separated from the recess filled with the oil, it can prevent the processing circuit of the circuit chip from contacting the oil.

Even in this case, the circuit chip can be electrically connected with the terminal pin by a bonding wire, or can be electrically connected with the terminal pin by a bump.

As an example, the connector case has an opening portion at a side opposite to the recess, the terminal pin is exposed in the opening portion to be connectable to the exterior, and the circuit chip is located in the opening portion. In this case, the circuit chip and a connecting part for connecting the circuit chip with the terminal pin can be covered by a resin member.

Alternatively, the connector case has an opening portion at a side opposite to the recess, the terminal pin is exposed in the opening portion to be connectable to the exterior, and the circuit chip is located in a space of the connector case, separated from the recess and the opening portion.

BRIEF DESCRIPTION OF THE DRAWINGS

The above and other objects, features and advantages of the present invention will become more apparent from the following detailed description of preferred embodiments made with reference to the accompanying drawings, in which.

DETAILED DESCRIPTION OF THE PREFERRED EMBODIMENTS

Preferred embodiments according to the present invention will be described with reference to the appended drawings.

First Embodiment

Figure 1:
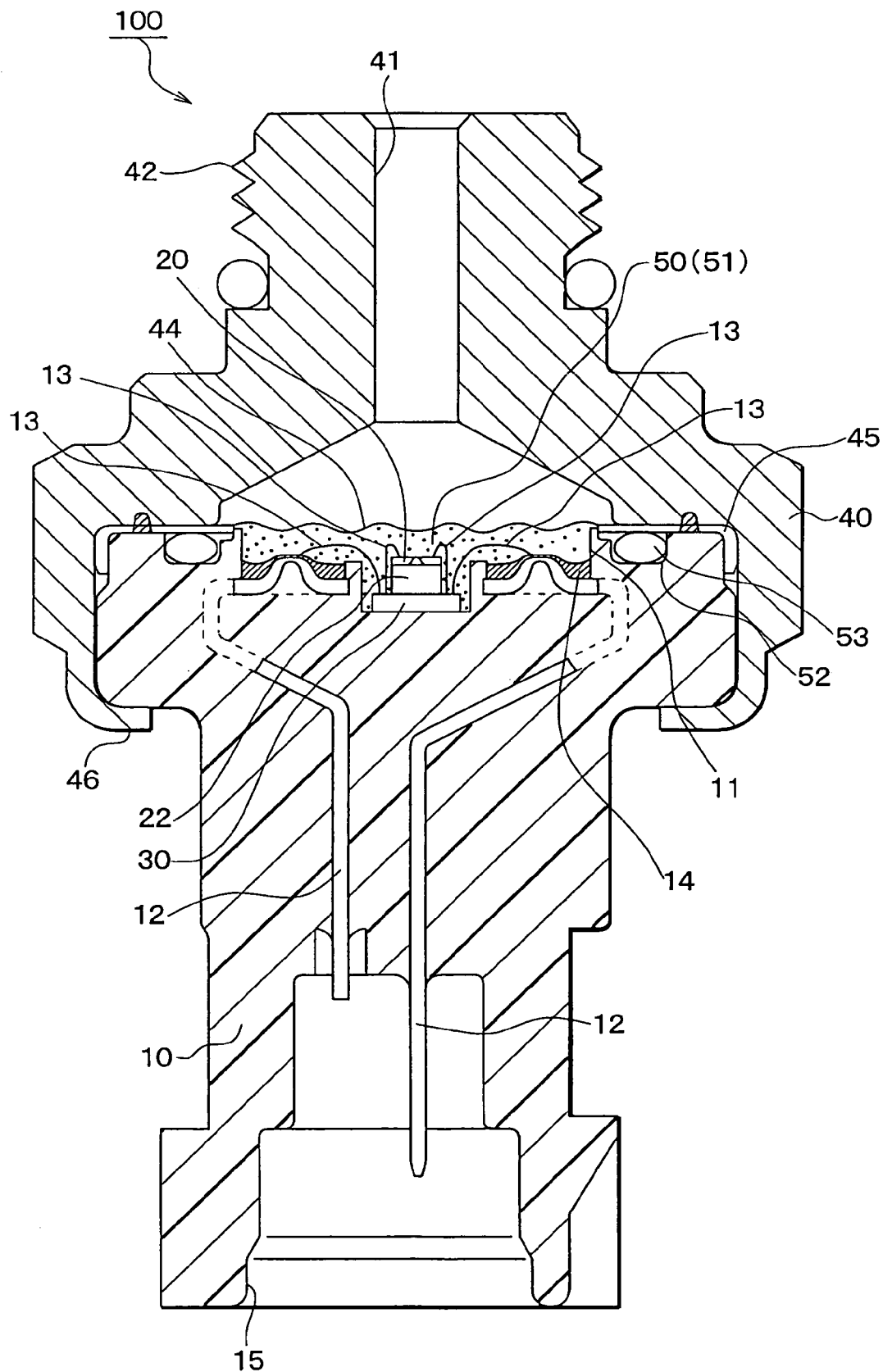
FIG. 1 is a schematic cross-sectional view showing a liquid-sealed diaphragm type pressure sensor according to a first preferred embodiment of the present invention.

FIG. 1 is a cross-sectional view illustrating a liquid-sealed diaphragm type pressure sensor 100 according to the first embodiment of the present invention.

The pressure sensor 100 includes a connector case 10, which is formed from resin such as polyphenylene sulphide (PPS) or polybutylene terephthalate (PBT), by molding. In the embodiment, the connector case 10 has a substantially cylindrical shape. On a first end surface of this resinous connector case 10, a recess 11 is formed to be dented from the surface.

The sensor chip 20, which is a sensing part for pressure detection, is contained within the recess 11. The sensor chip 20 can be any types, such as a piezo-type or an electrostatic capacitance type, as long as it can generate a corresponding level of an electric signal in accordance with an applied pressure.

Figure 2:
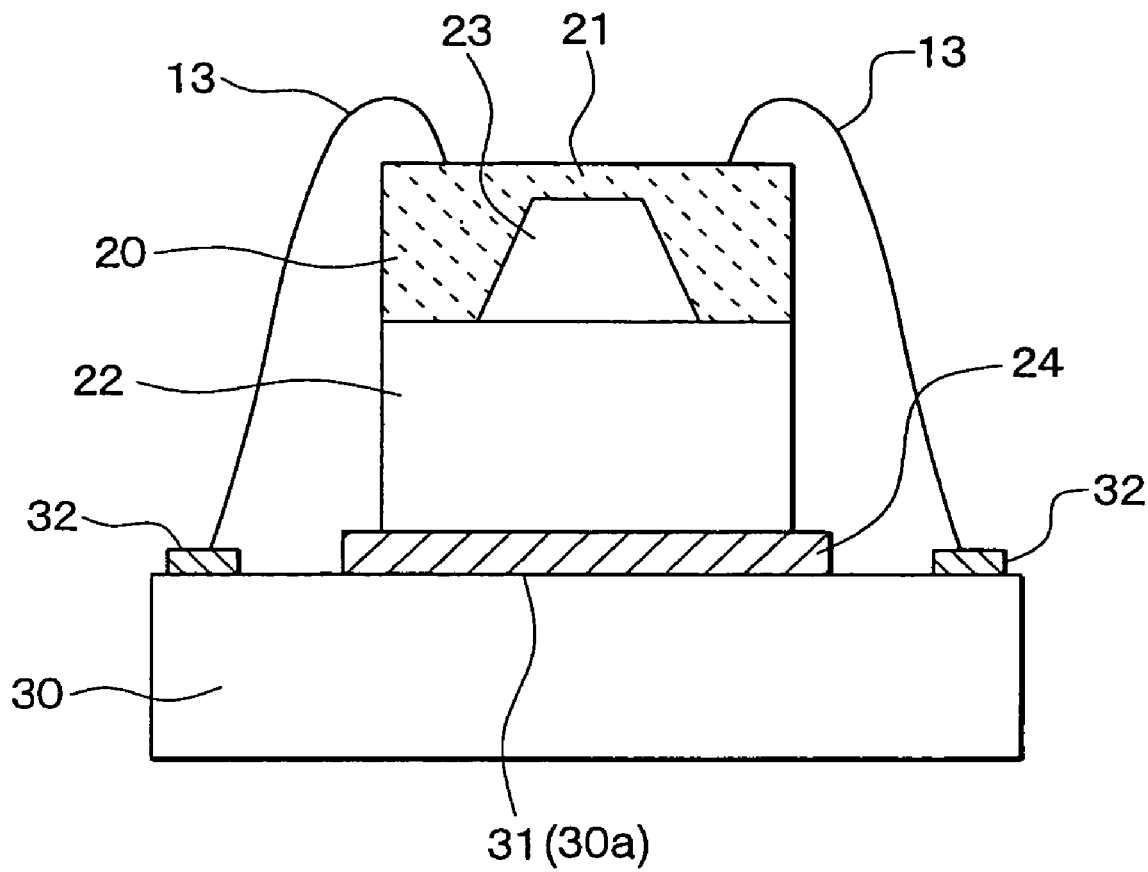
FIG. 2 is an enlarged cross-sectional view showing a sensor chip and a circuit chip in the pressure sensor of FIG. 1.

As shown in FIG. 2, the sensor chip 20 includes a diaphragm 21 for receiving pressure, a bridge circuit (not shown) formed on the diaphragm 21, etc. The sensor chip 20 is a diaphragm type semiconductor, which converts the received pressure to electric signals and outputs the electric signals as sensor signals.

The sensor chip 20 is integrally formed with a glass pedestal 22 made of glass by anodizing, for example. In the sensor chip 20, a vacuum chamber 23, which is sealed airtightly, is formed between a dented portion and a back surface of the diaphragm 21 and the glass pedestal 22.

The sensor chip 20 is stacked on the circuit chip 30 via the glass pedestal 22 therebetween. As shown in FIG. 2, the sensor chip 20 and the circuit chip 30 are bonded and fixed each other by an adhesive material 24 such as an adhesive or an adhesive sheet.

The circuit chip 30 is bonded and fixed to a bottom wall surface of the recess 11 of the connector case 10 by using an adhesive (not shown in FIG. 1 through FIG. 3B.) Here, the adhesive for bonding the circuit chip 30 to the connector case 10 is shown as an adhesive 25 in FIG. 4A to follow.

That is, a stacked body constructed with the sensor chip 20 and the circuit chip 30 is contained within the recess 11 and is fixed to the connector case 10. In other words, the circuit chip 30 is stacked with the sensor chip 20 and is located between the sensor chip 20 and the bottom wall surface of the recess 11 of the connector case 10.

The circuit chip 30 is formed by a generally-known semiconductor manufacturing process. For example, a MOS transistor or a bipolar transistor is formed in a silicon substrate or the like. These elements form a processing circuit 30a on the circuit chip 30.

The processing circuit 30a formed on the circuit chip 30 is for processing the signals generated at the sensor chip 20. To be specific, the processing circuit 30a has functions such as applying a voltage to the sensor chip 20, and processing (amplifying or controlling) the received signals from the sensor chip 20.

Figure 3A:
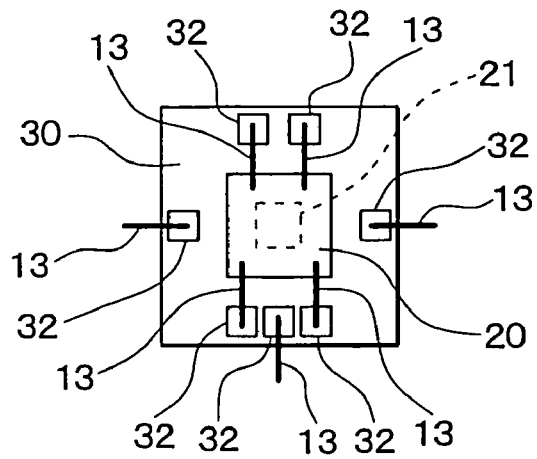
FIG. 3A is a top view showing the sensor chip and the circuit chip of the pressure sensor in FIG. 1.
Figure 3B:
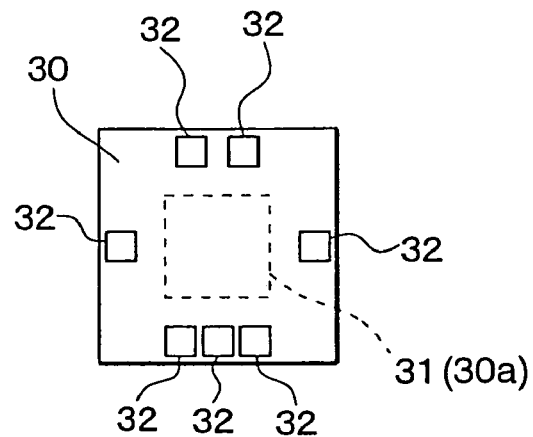
FIG. 3B is a top view showing the circuit chip of the pressure sensor in FIG. 1.

As shown in FIG. 2 and FIG. 3B, the processing circuit 30a for processing the signals as described above, is arranged in a region 31 positioned in a center area of the circuit chip 30. Although not shown, a protective film for protecting the processing circuit 30a, made of silicon nitride or polyimide, is formed on the surface of the circuit chip 30.

Pads 32 for wire bonding or inspection are arranged in an outer circumference portion in the circuit chip 30, that is, in a periphery of the region 31 in which the processing circuit 30a is formed. The pads 32 are formed from an aluminum sheet or the like by sputtering, etc., and exposed from the protective film.

The region 31 of the circuit chip 30 is also used as a place for arranging the sensor chip 20. As shown in FIG. 2 and FIG. 3B, the sensor chip 20 is located on the adhesive material 24 at a position corresponding to the region 31. That is, the processing circuit 30a formed in the region 31 is covered and protected by the sensor chip 20 layered thereon.

The sensor chip 20 and the pads 32 of the circuit chip 30 are connected by bonding wires 13, thereby the sensor chip 20 and the circuit chip 30 are electrically connected. The bonding wires 13 can be formed by a generally-known bonding wire forming method using gold (Au) or aluminum (Al).

Also, as shown in FIG. 1, in the pressure sensor 100, several metallic bar-shaped terminal pins 12 are provided to penetrate the connector case 10, for electrically connecting the sensor chip 20 and the circuit chip 30 to external circuits.

In this embodiment, the terminal pins 12 are made from a plated material, for example, brass with Ni plating. The terminal pins 12 are integrally formed with the connector case 10 by insert-molding thereby supported within the connector case 10.

As shown in FIG. 1, a first end (e.g., upper end in FIG. 1) of each terminal pin 12 projects and is exposed to the recess 11 of the connector case 10 in the vicinity of the sensor chip 20. Furthermore, as shown in FIG. 1, a second end (e.g., lower end in FIG. 1) of each terminal pin 12 projects and is exposed in an opening portion 15 of a second end of the connector case 10.

The first end of each terminal pin 12 exposing to the recess 11 and the circuit chip 30 are connected by the bonding wires 13, which is also used for connecting the sensor chip 20 with the circuit chip 30, thereby both the chips 20, 30 and the terminal pins 12 are electrically connected.

A sealing material 14 made of, for example a silicon resin, is filled within the recess 11 as shown in FIG. 1. A gap between a base of the terminal pins 12 projecting to the recess 11 and the connector case 10 is sealed with the sealing material 14.

In FIG. 1, the second end (lower end portion in FIG. 1) of the connector case 10 is formed to have the opening portion 15. The opening portion 15 is a connecting portion for electrically connecting the second end of each terminal pin 12 to the external circuits via external wires, such as wire harnesses (not shown).

That is, the second end of each terminal pin 12 exposed to the opening portion 15 can be electrically connected to the exterior through the opening portion 15. Therefore, signal transmission between the sensor chip 20 and the circuit chip 30, and the exterior is performed through the bonding wires 13 and the terminal pins 12.

As shown in FIG. 1, in the pressure sensor 100 of this embodiment, a housing 40, which is used as a pressure introducing member, is mounted to the first end of the connector 10, in which the recess 11 is provided.

The housing 40 is made of a metallic material such as stainless steel (SUS). The housing 40 includes a pressure introducing passage 41 for introducing pressure of a subject medium to be measured, and a screw portion 42 for fixing the pressure sensor 100 to a fixing portion of a device, from which a subject medium is introduced.

Further, a metal diaphragm 44 made from a thin metal (e.g., SUS) and a retainer (a ring weld) 45 made from a metal (e.g., SUS) are welded to the housing 40 at its entire periphery thereof, and joined airtightly to one end of the pressure introducing passage 41.

As shown in FIG. 1, one end portion of the housing 40 is fastened to the first end of the connector case 10 to form a fastening portion 46. The fastening portion 46 fixes the housing 40 and the connector case 10 integrally.

In the connector case 10 and the housing 40 assembled as above, the recess 11 of the connector case 10 is sealed with the metal diaphragm 44, thereby a pressure detecting chamber 50 is formed between the recess 11 and the metal diaphragm 44.

The pressure detecting chamber 50 is filled with an oil 51 (e.g., fluoro oil), which is a pressure transmitting medium as well as a filler, and the chamber 50 is sealed by the oil 51. The pressure detecting chamber 50 is structured also as an oil chamber containing therein the sensor chip 20 and filled with the oil 51.

In the recess 11, the oil 51 is filled to cover the electrically connecting portions between the sensor chip 20, the circuit chip 30 and the bonding wires 13. Further, the oil 51 is covered and sealed by the metal diaphragm 44.

By forming the pressure detecting chamber 50 described as above, the pressure drawn through the pressure introducing passage 41 is applied to the sensor chip 20 in the pressure detecting chamber 50 via the metal diaphragm 44 and the oil 51.

A ring shaped trench (an O-ring trench) 52 is formed around an outer periphery of the pressure detecting chamber 50 of the connector case 10. An O-ring 53 is arranged within the O-ring trench 52 to seal the pressure detecting chamber 50 airtightly.

The O-ring 53 is made of an elastic material such as silicon rubber, which is sandwiched and compressed by the connector case 10 and the retainer 45. Therefore, the pressure detecting chamber 50 is sealed and closed by the metal diaphragm 44 and the O-ring 53.

Characteristic structures in the pressure sensor 100 according to this embodiment will be explained next.

The sensor chip 20 for detecting pressure and the circuit chip 30 having the processing circuit 30a for processing the signals from the sensor chip 20 are formed as independent chips, and both the chips are electrically connected by the bonding wires 13.

Further, as explained above, by providing the circuit chip 30 between the sensor chip 20 and the bottom wall surface of the recess 11, the sensor chip 20 is layered on the top of the circuit chip 30.

In this structure, the processing circuit 30a of the chip 30 is located in a portion of the connector case 10, where the processing circuit 30a is not in contact with the oil 51. That is, the processing circuit 30a of the circuit chip 30 is covered to be not exposed to the oil 51.

Next, a method for manufacturing the pressure sensor 100 will be described. The connector case 10 having insert-molded terminal pins 12 is prepared.

The circuit chip 30 and the sensor chip 20 are provided to be stacked within the recess 11 of the connector case 10. The sensor chip 20 is electrically connected with the circuit chip 30, and the circuit chip 30 is electrically connected with the terminal pins 12 by the bonding wires 13.

The connector case 10 is arranged so that the dented portion of the recess 11 faces upwardly. A predetermined amount of the oil 51 made of the fluoro oil or the like is filled in the recess 11 by a dispenser or similar tools.

Subsequently, the housing 40, of which periphery is welded to the metal diaphragm 44 and the retainer 45 at its entirety, is joined airtightly to the one end of the pressure introducing passage 41, is prepared. The housing 40 is lowered, by maintaining its horizontal level, to fit into the connector case 10. This assembled part is placed into a vacuum chamber for performing vacuuming so that a remaining air in the pressure detecting chamber 50 is purged.

Then, the connector case 10 and the retainer 45 of the housing 40 are compressed to abut sufficiently. As a result, the pressure detecting chamber 50, which is sealed by the metal diaphragm 44 and the O-ring 53, is formed.

The fastening portion 46 is formed by fastening the one end portion of the housing 40 to the first end of the connector case 10 so that the housing 40 and the connector case 10 become integrated. Therefore, the connector case 10 and the housing 40 are assembled and fixed by the fastening portion 46 thereby the assembly of the pressure sensor 100 is completed.

Next, a pressure detecting operation of the pressure sensor 100 will be described.

The pressure sensor 100 is attached to an appropriate part of the fixing portion of the device through the screw portion 42 of the housing 40. A measured pressure of the subject medium is introduced from the device into the pressure sensor 100 through the pressure introducing passage 41.

The introduced pressure is applied to the diaphragm 21 of a pressure receiving surface, which is a surface of the sensor chip 20, via the metal diaphragm 44 and the oil 51 in the pressure detecting chamber 50. Electric signals corresponding to the applied pressure are outputted as sensor signals from the sensor chip 20.

These sensor signals are transmitted to the circuit chip 30 from the sensor chip 20 through the bonding wires 13. At the circuit chip 30, the signals are processed and outputted to the external circuit through the bonding wires 13 and the terminal pins 12. Accordingly, the pressure sensor 100 detects the pressure of the subject medium introduced into the pressure introducing passage 41.

According to the present embodiment, the pressure sensor 100 includes the connector case 10 having the recess 11 on one end side thereof, the sensor chip 20 for pressure detection contained in the recess 11, the oil 51 filled in the recess 11, and the metal diaphragm 44 for closing the recess 11. In the pressure sensor 100, the processing circuit 30a of the circuit chip 30, for processing the signals transmitted from the sensor chip 20, is located at a place in the connector case 10 such that the processing circuit 30a of the circuit chip 30 can avoid a contact with the oil 51. Furthermore, the sensor chip 20 and the circuit chip 30 are electrically connected.

The circuit chip 30 for processing the signals generated from the sensor chip 20 is formed as a chip separated from the sensor chip 20. Further, the processing circuit 30a of the circuit chip 30 is disposed at a position so that the processing circuit 30a of the circuit chip 30 does not contact the oil 51 of the connector case 10. Therefore, in the liquid-sealed diaphragm type pressure sensor 100, the processing circuit 30a is prevented from being charged due to a polarization of the oil 51 as much as possible.

In this preferred embodiment, as shown in FIG. 1 to FIG. 3B, the circuit chip 30 is inserted between the bottom wall surface of the recess 11 and the sensor chip 20. Therefore, the processing circuit 30a of the circuit chip 30 is disposed in a suitable place where the processing circuit 30a of the circuit chip 30 does not contact the oil 51 of the connector case 10. That is, the processing circuit 30a of the circuit chip 30 is not exposed in the oil 51.

In this embodiment, a stacking structure, in which the sensor chip 20 as a sensing part is stacked with the circuit chip 30 as a circuit part, while the chips 20,30 are formed separately, is applied. Therefore, an overall chip size including the sensor chip 20 and the circuit chip 30 in the same plane direction can be reduced.

Figure 3C:
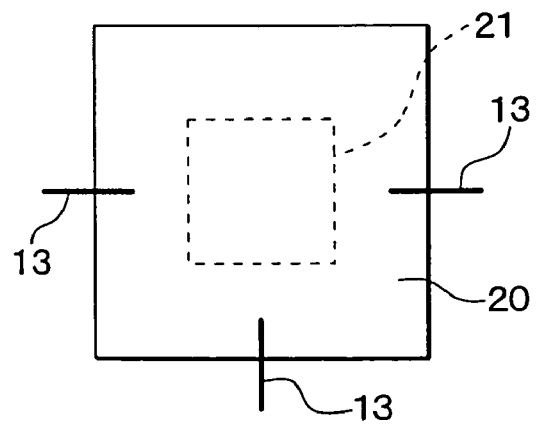
FIG. 3C is a top view showing a sensor chip in a comparison example.

A plane shape of a sensor chip 20 in a comparison example is shown in FIG. 3C. In this sensor chip 20, a diaphragm 21 having the stress gauges in its center, is formed. The circuit part is formed in the circumferential part of the diaphragm 21. Therefore, in the sensor chip 20 of FIG. 3C, the overall size of the chip becomes large, because both the sensing part and the processing circuit part are formed on the same chip.

As understood from a comparison of FIG. 3A with FIG. 3C, the size of the sensor chip 20 of FIG. 3C in the plane direction is larger than that of the sensor chip 20 of the present embodiment. According to the preferred embodiment of the present invention, the size of the stacked sensor chip 20 and the circuit chip 30 can be effectively reduced in the plane direction compared with the sensor chip 20.

The stacking structure as shown in this embodiment, in which the sensor chip 20 is layered on the circuit chip 30, contributes the compactness of the chips not only in the plane direction but also in the vertical direction (the stacking direction of the chips).

Figure 4A:
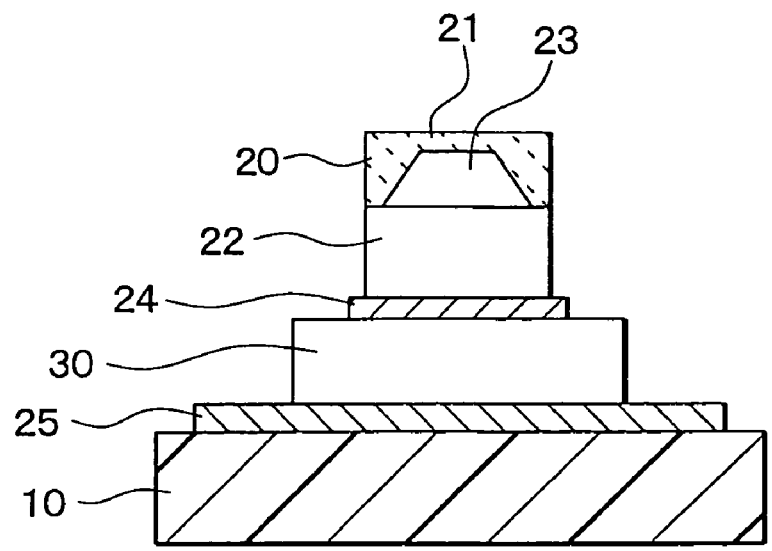
FIGS. 4A and 4B are cross-sectional views for explaining a compactness of the chips of the pressure sensor in a vertical direction according to the first embodiment.
Figure 4B:
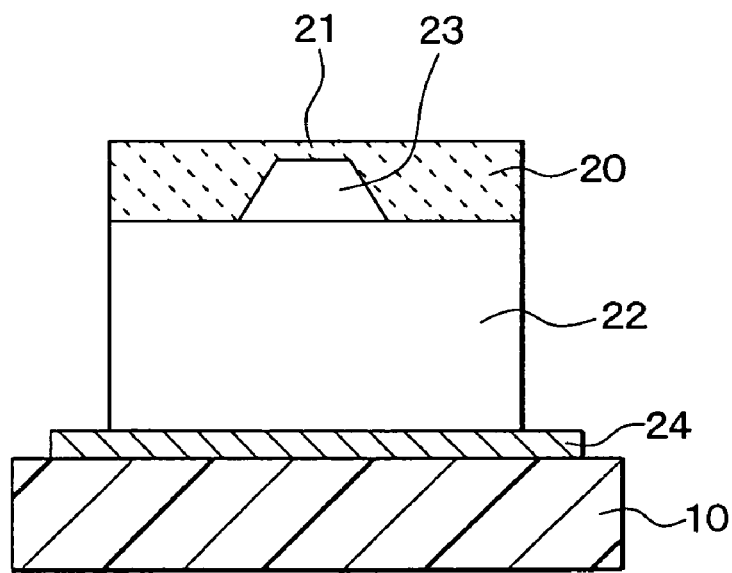

FIGS. 4A and 4B are cross-sectional views of the layered chips and other components for explaining the reduction in size of the chips in the vertical direction. FIG. 4A shows the structure of the chips according to the present embodiment. FIG. 4B shows the structure of chips of a comparison example.

As shown in FIG. 4B, in the comparison example, a glass pedestal 22 is layered on the connector case 10 through a single layer adhesive material 24 therebetween. Here, differences in coefficients of thermal expansion between the resinous connector case 10 and the components layered thereon cause a deformation. In order to prevent such deformation from being applied to the sensor chip 20, the glass pedestal 22 is made thick to absorb such deformation in the comparison example of FIG. 4B.

In this embodiment, to the contrary, as shown in FIG. 4A, two-layer adhesive structure with the resinous adhesive material 24 and the adhesive 25, is provided between the resinous connector case 10 and the sensor chip 20 with respect to the stacking direction.

Therefore, in this embodiment, the deformation caused by the differences in the coefficients of thermal expansion among the components, can be absorbed by the two resinous layers of the adhesive material 24 and the adhesive 25. Therefore, there is no need to form the glass pedestal 22 as thick as in the sensor chip 20 of FIG. 4B.

If the sensor chip 20 and the glass pedestal 22 shown in FIG. 4B are used in the stacking structure of this embodiment, the total height from the sensor chip 20 to the circuit chip 30 of the pressure sensor becomes higher. However, it is possible to reduce sensor dimension in the vertical direction by reducing the thickness of the glass pedestal 22 even when the size of the chip structure is reduced in the plane direction.

(Modifications)

Next, modifications of the first embodiment will be explained by referring to FIG. 5 through FIG. 9. FIGS. 5 to 9 show first to fifth modifications of the first embodiment respectively.

Figure 5:
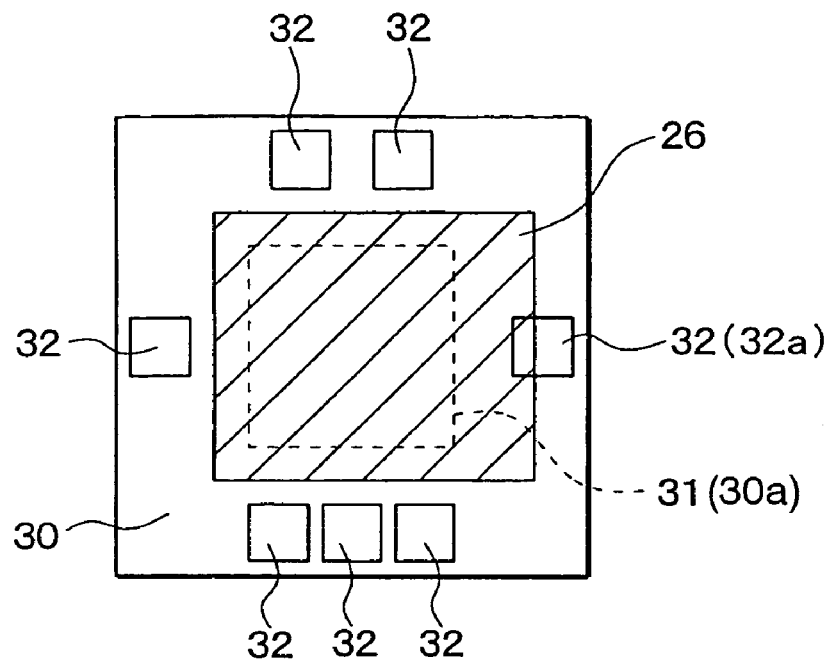
FIG. 5 is a top view showing a circuit chip used in a first modification of the first embodiment.

FIG. 5 shows a top view of a circuit chip 30 used in the first modification. In this modification, a conductive connecting member 26 having electric conductivity, is used as an adhesive material located between the sensor chip 20 and the circuit chip 30 for connecting both the chips 20,30, in the stacking structure as shown in FIG. 2.

FIG. 5 shows a state in which the conductive connecting member 26 with the glass pedestal 22 is disposed on an upper surface of the circuit chip 30. The sensor chip 20 is attached to the upper surface of the circuit chip 30. The conductive connecting member 26 is indicated with the diagonal lines in FIG. 5 through FIG. 7. This is for distinguishing the conductive connecting member 26 from the other components, but not for indicating cross-sections.

As the conductive connecting member 26, a conductive adhesive material made of an epoxy resin containing a conductive filler such as silver (Ag) or copper (Cu) or a conductive adhesive sheet, can be used.

In the circuit chip 30 shown in FIG. 5, a part of the pads 32, which are formed on the upper surface of the circuit chip 30, is used as a pad 32a for ground (GND). The pad 32a for GND is electrically connected to a GND potential part in the pressure sensor 10, by using the bonding wire 13 connected to the pad 32a for GND.

On the upper surface of the circuit chip 30, similarly to the adhesive material 24 in FIG. 3, the conductive connecting member 26 is disposed on the region 31 where the processing circuit 30a for processing the electric signals is formed. In this modification, the conductive connecting member 26 extends largely from the region 31 to the pad 32a for GND to be overlapped with a part of the pad 32a.

According to the first modification, in the pressure sensor 100 of the first embodiment, the stacked sensor chip 20 and the circuit chip 30 are connected by the conductive connecting member 26 having the electrical conductivity. The pad 32a for GND, which is set as the GND potential, is disposed on the circuit chip 30. Therefore, in the pressure sensor 100, the pad 32a for GND and the conductive connecting member 26 are electrically connected.

The surface of the circuit chip 30 is electrically connected with the pad for GND via the conductive connecting member 26. Therefore, a surface potential of the circuit chip 30 becomes stable, thereby charging of the chip 30 can be easily restricted.

Figure 6:
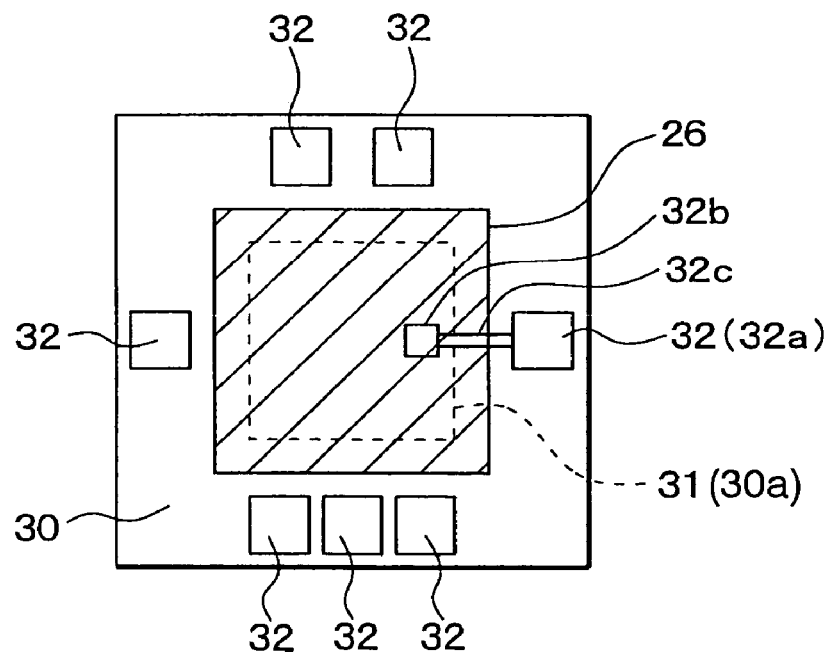
FIG. 6 is a top view showing a circuit chip used in a second modification of the first embodiment.

FIG. 6 shows a top view of a circuit chip 30 used in the second modification. In this modification, the conductive connecting member 26 is arranged on the surface of the circuit chip 30, on which the sensor chip 20 is stacked. This is a further modification of the first modification.

On the circuit chip 30 shown in FIG. 6, a part of the pads 32, which are formed on the upper surface of the circuit chip 30, is formed as the pad 32a for GND as in the first modification.

However, in FIG. 6, on the region 31 in which the processing circuit 30a for signal processing is formed, a connecting pad 32b for the conductive connecting member 26, is disposed. In addition, a wiring 32c, made of aluminum (Al) or the like, is provided for connecting the pad 32b with the pad 32a for GND.

In FIG. 6, the conductive connecting member 26 overlaps the pad 32b for connecting the conductive connecting member 26. However, unlike in FIG. 5, the conductive connecting member 26 is arranged so as not to overlap the pad 32a for GND.

In this example of FIG. 6, the conductive connecting member 26 is electrically connected with the pad 32b, and is set as the GND potential via the wiring 32c, via the pad 32a for GND and further via the bonding wire 13 connected to the pad 32a for GND.

Similarly to the first modification shown in FIG. 5, the surface of the circuit chip 30 is electrically connected with the pad 32a for GND via the conductive connecting member 26. Therefore, the surface potential of the circuit chip 30 becomes stable thereby charging of the chip 30 can be easily restricted.

Figure 7:
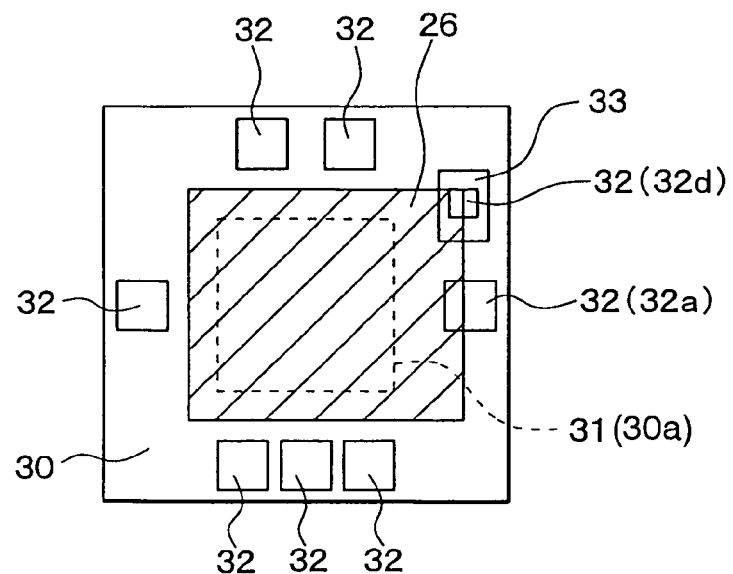
FIG. 7 is a top view showing a circuit chip used in a third modification of the first embodiment.

FIG. 7 shows a top view of a circuit chip 30 used in the third modification. In this modification, the conductive connecting member 26 is arranged on the surface, on which the sensor chip 20 is stacked. This third modification is a still further modification of the first modification shown in FIG. 5.

In the modification shown in FIG. 7, similarly to the first modification shown in FIG. 5, the conductive connecting member 26 is arranged on the region 31 on the upper surface of the circuit chip 30, and projects largely from the region 31 towards the pad 32a for GND so that the conductive connecting member 26 overlaps the pad 32a partially.

In the circuit chip 30 shown in FIG. 7, a part of the pads 32 is set as an inspection pad 32d for inspecting an inner circuit of the circuit chip 30.

The inspection pad 32d is for inspecting the processing circuit 30a of the circuit chip 30 by using a probe for inspection, for example. When the inspection is not performed, the pad 32d is no longer used and is not connected to the bonding wire 13, etc.

In this modification of FIG. 7, the conductive connecting member 26 extends from the region 31 significantly, to be overlapped with the inspection pad 32d. In this case, if the inspection pad 32d and the conductive connecting member 26 are connected electrically, the processing circuit 30a of the circuit chip 30 fails to function.

Therefore, in this modification, as shown in FIG. 7, an insulating film 33 made of resin or the like is formed on the inspection pad 32d, and the conductive connecting member 26 is arranged thereon. As a result, the conductive connecting member 26 is electrically insulated with respect to the inspection pad 32d. Therefore, the processing circuit 30a of the circuit chip 30 functions normally.

Figure 8:
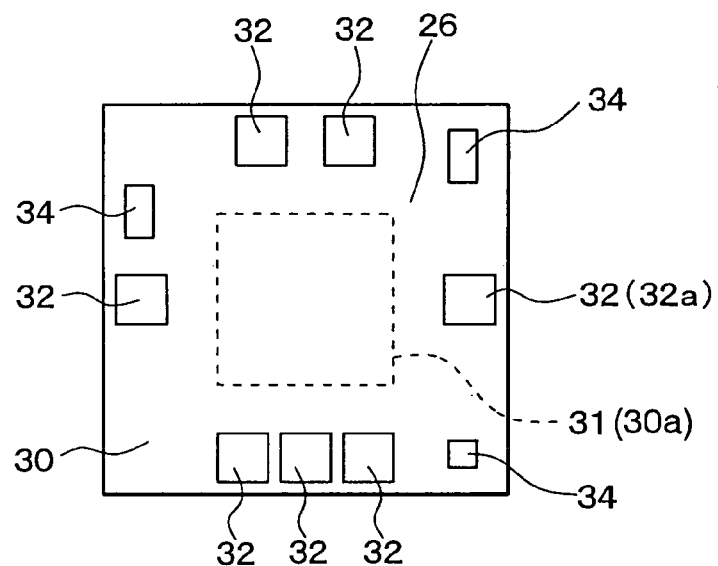
FIG. 8 is a top view showing a circuit chip used in a fourth modification of the first embodiment.

FIG. 8 shows a top view of a circuit chip 30 used for the fourth modification. In this modification, on the upper surface of the circuit chip 30, trim resistances 34 are provided in the vicinity of the region 31. The sensor chip 20 is arranged above the region 31, as described above.

The trim resistances 34 are for controlling a resistance value of the processing circuit 30a of the circuit chip 30. The resistance value can be controlled by cutting the trim resistances 34 using a laser radiation, for example.

In the circuit chip 30 shown in FIG. 8, after the sensor chip 20 is layered on the circuit chip 30, the trim resistances 34 can be arranged as being exposed around the sensor chip 20.

Therefore, even after the sensor chip 20 is attached to the circuit chip 30, the resistance in the processing circuit 30a can be controlled by the laser radiation to the trim resistances 34. Here, if the trimming of the resistances is performed by an electric trim, there is no need to arrange the trim resistances 34 shown in FIG. 8, but the control of the resistance value can be performed later.

Figure 9:
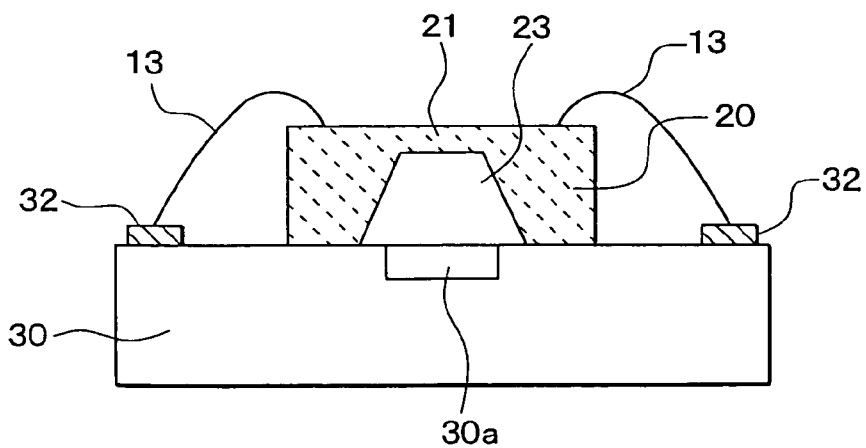
FIG. 9 is a schematic cross-sectional view showing a stacked structure of a sensor chip and a circuit chip in a fifth modification of the first embodiment.

FIG. 9 shows a schematic cross-sectional view showing a layered structure of a sensor chip 20 and a circuit chip 30 of a fifth modification of the first embodiment. As shown in FIG. 9, the sensor chip 20 can be directly stacked with the circuit chip 30 without a glass pedestal 22.

In this case, the sensor chip 20 can be connected and fixed to the circuit chip 30 by anodizing or the like. When the sensor chip 20 and the circuit chip 30 are connected by anodizing, a connection part should be arranged to avoid the processing circuit 30a for signal processing, formed on the circuit chip 30.

In this modification, the vacuum chamber 23 is formed between the dented portion on the back surface of the diaphragm 21 of the sensor chip 20 and the circuit chip 30. A state in the vacuum chamber 23 can be made atmospheric, instead of vacuum.

According to this modification of FIG. 9, because the glass pedestal 22 is omitted, both a manufacturing cost and an assembled size can be reduced. Also, in this modification, the surfaces for the wire bonding of the sensor chip 20 and the circuit chip 30 are arranged closer with respect to the vertical direction of the chips. Therefore, the wire bondings can be made more easily and a reliability of the bondings improves.

According to the above-described modifications of FIGS. 5 to 9, the processing circuit 30a of the circuit chip 30 is disposed at a position so that the processing circuit 30a of the circuit chip 30 does not contact the oil 51 of the connector case 10, similarly to the first embodiment.

Second Embodiment

Figure 10:
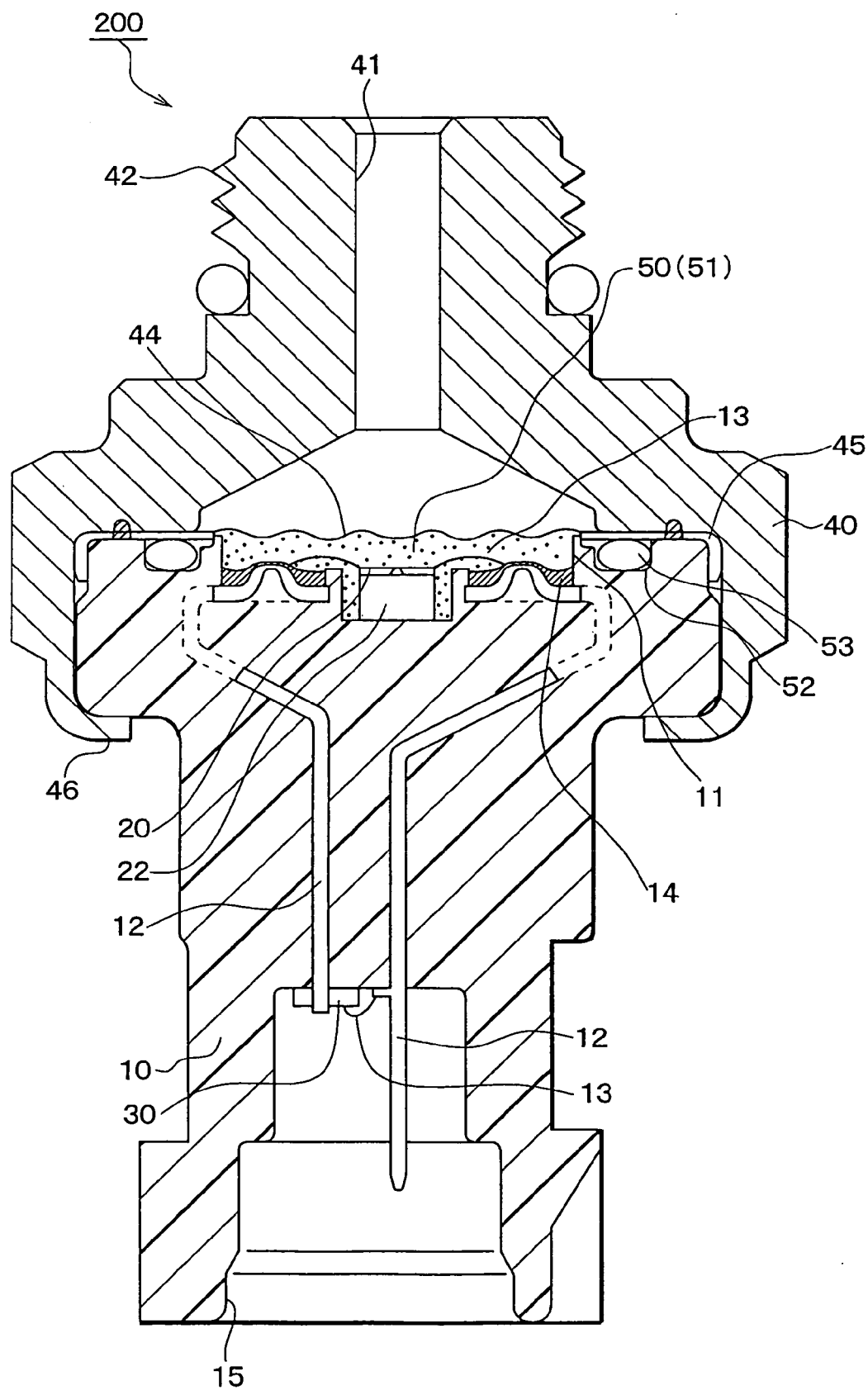
FIG. 10 is a schematic cross-sectional view showing a liquid-sealed diaphragm type pressure sensor according to a second preferred embodiment of the present invention.

FIG. 10 shows a cross-sectional view illustrating a liquid-sealed diaphragm type pressure sensor 200 according to a second embodiment of the present invention.

Figure 11A:
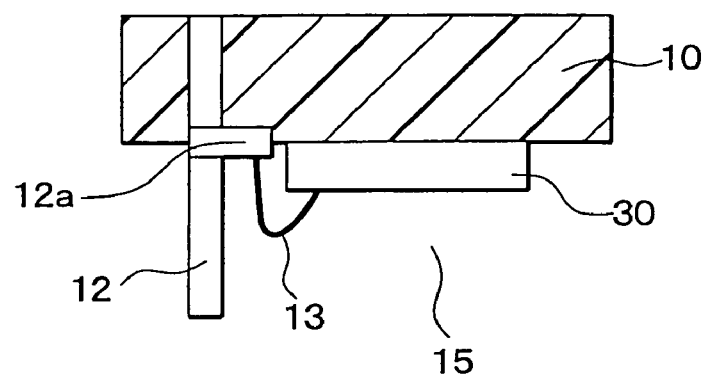
FIG. 11A is an enlarged sectional view showing a circuit chip of the pressure sensor in FIG. 10
Figure 11B:
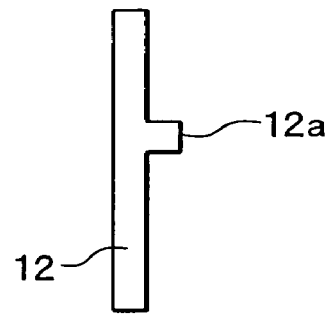
FIG. 11B is a side view of a terminal pin of FIG. 11A.

FIG. 11A shows an en enlarged view of the circuit chip 30 of the pressure sensor 200 shown in FIG. 10. FIG. 11B shows a side view of the terminal pin 12 shown in FIG. 11A.

In this embodiment, it is the same as in the first embodiment that the sensor chip 20 and the circuit chip 30 are formed independently, and the processing circuit 30a of the circuit chip 30 is formed such that the processing circuit 30a of the circuit chip 30 does not contact the oil 51 in the connector case 10.

However, as shown in FIG. 10, the circuit chip 30 is not formed in the recess 11 of the connector case 10, but at a different part of the connector case 10. The sensor chip 20 and the circuit chip 30 are electrically connected by the terminal pins 12, which are lead members, provided in the connector case 10. The following explanations will be made mainly focusing on differences from the first embodiment.

In the pressure sensor 200, as shown in FIG. 10, the sensor chip 20 is fixed and bonded to the bottom wall surface of the recess 11 of the connector case 10 by using the adhesive material or the like, through the glass pedestal 22 therebetween. That is, in this embodiment, the sensor chip 20 is contained and fixed within the recess 11 as shown in FIG. 4B.

The sensor chip 20 is electrically connected with each first end of the terminal pins 12, which are exposed to the recess 11, by the bonding wires 13. Here, the arrangement of the sensor chip 20 into the connector case 10 and electrical connection of the sensor chip 20 in the connector case 10 can be performed similarly to the pressure sensor described in U.S. Pat. No. 5,595,939 (corresponding to JP-A-7-243926), which is incorporated herein by reference.

Also, as shown in FIG. 10, in the pressure sensor 200 of the second embodiment, the circuit chip 30 is contained within the opening portion 15, and is connected and fixed to the connector case 10 by using an adhesive material, etc.

The circuit chip 30 is electrically connected to the second ends of the terminal pins 12 exposed to the inside of the opening portion 15 of the connector case 10. In this embodiment, the circuit chip 30 is connected with several terminal pins 12 by using bonding wires 13.

Here, as shown in FIGS. 11A and 11B, the second end of the terminal pin 12, exposed to the inside of the opening portion 15 in the connector case 10, has a bending portion 12a. The bending portion 12a protrudes from the terminal pin 12 to be bent in a direction approximately perpendicular to a longitudinal direction of the terminal pin 12.

By forming the bending portion 12a as explained, the bonding wires 13 can be connected at the bending portion 12a, and the wire bonding between the bending portion 12a and the circuit chip 30 can be easily performed.

In the pressure sensor 200 of the second embodiment, the sensor chip 20 and the circuit chip 30 are electrically connected by the bonding wires 13, through the terminal pins 12 and the bonding wires 13.

Next, a manufacturing method and a detecting operation of the pressure sensor 200 shown in FIG. 10 will be described by focusing on differences over the first embodiment.

The manufacturing method of the pressure sensor 200 will be described first. The connector case 10 having the insert-molded terminal pins 12 is prepared. Here, in the connector case 10, the circuit chip 30 is provided in the opening portion 15 and the circuit chip 30 is connected to the terminal pins 12 by wire bonding.

Next, in the recess 11 of the connector case 10, the sensor chip 20 is located through the glass pedestal 22 therebetween. The sensor chip 20 is connected to the terminal pins 12 by the bonding wires 13.

Then, the oil 51 is filled into the recess 11, and the housing 40 to which the metal diaphragm 44 is joined, is assembled to the connector case 10 so that the pressure detecting chamber 50 is formed.

Thus, the manufacturing of the pressure sensor 200 is completed. The electric connection and the fixing of the circuit chip 30 into the opening portion 15 of the connector case 10 may be performed after the housing 40 is attached to the connector case 10.

A pressure detection operation of the pressure sensor 200 will be described next. The pressure introduced from the pressure introducing passage 41 is applied to the diaphragm 21 of the sensor chip 20, via the metal diaphragm 44 and the oil 51, and the sensor signals are outputted from the sensor chip 20.

In this embodiment, the sensor signals are transmitted from the sensor chip 20 to the circuit chip 30 through the bonding wires 13 and the terminal pins 12.

Furthermore, the processed signals of the circuit chip 30 are outputted to the external circuit via the bonding wire 13 and the terminal pins 12.

As explained, in the liquid-sealed diaphragm type pressure sensor 200 of the second embodiment, the processing circuit 30a of the circuit chip 30 for processing the signals received from the sensor chip 20, is arranged at a position in the connector case 10, where the processing circuit 30a does not contact with the oil 51 while the sensor chip 20 is electrically connected with the circuit chip 30.

According to the pressure sensor 200 in the second embodiment, as is the same in the first embodiment, the processing circuit 30a provided in the circuit chip 30 is effectively restricted from being charged by the oil 51.

Especially, in the pressure sensor 200 as shown in FIG. 10, the circuit chip 30 is provided in the opening portion 15 at a position separated from the recess 11 in the connector case 10. The sensor chip 20 is electrically connected with the circuit chip 30 via the terminal pins 12.

Because the circuit chip 30 is provided in the connector case 10 at a position different from the recess 11 in which the oil 51 is filled, the circuit chip 30 is prevented from contacting the oil 51 of the connector case 10.

Also, in the pressure sensor 200, as shown in FIG. 10, the circuit chip 30 is electrically connected to the terminal pins 12 (lead member) via the bonding wires 13.

Further, in the pressure sensor 200 shown in FIG. 10, because the circuit chip 30 is provided in the opening portion 15 in the connector case 10, the circuit chip 30 can be seen through this opening portion 15 after the assembly of the pressure sensor 200.

Therefore, as shown in FIG. 8, when the trim resistances 34 are provided to the circuit chip 30 in the pressure sensor 200, controlling of the resistance value is possible by the laser radiation to the trim resistances 34 exposed from the opening 15, after the assembly of the housing 40 to the connector case 10 is completed.

(Modifications)

Next, modifications of the second embodiment will be explained by referring to FIG. 12 through FIG. 15. FIGS. 12 to 15 show first to fourth modifications of the second embodiment, respectively.

Figure 12:
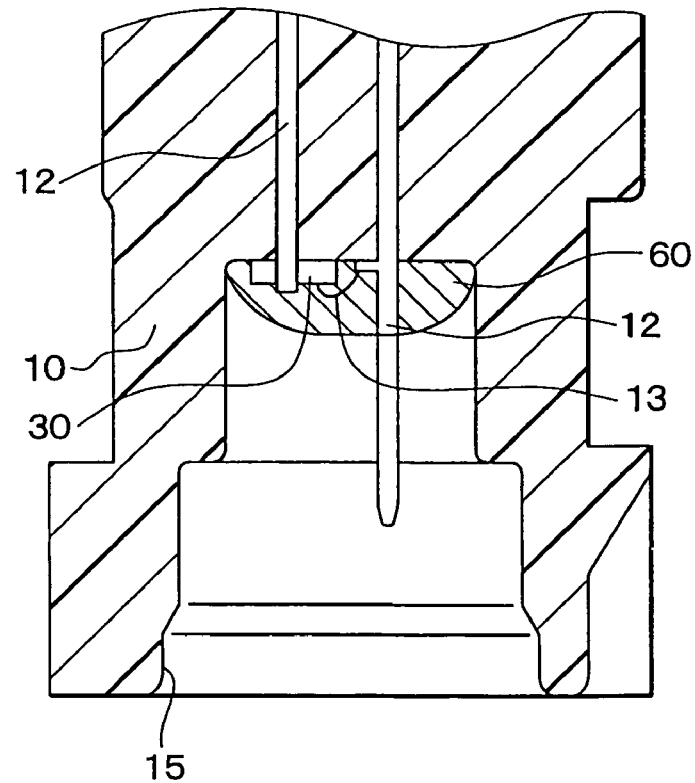
FIG. 12 is a schematic cross-sectional view showing a state wherein a circuit chip is provided in a first modification of the second embodiment.

FIG. 12 is a schematic cross-sectional view illustrating an arrangement of a circuit chip 30 in the first modification of the second embodiment. In FIG. 12, the circuit chip 30 is provided in the opening portion 15 of the connector case 10. The terminal pins 12 provided in the connector case 10 are connected with the circuit chip 30 by the bonding wire 13, similarly to the structure of FIG. 10.

Here, in the arrangement shown in FIG. 12, the circuit chip 30, the bonding wires 13, and a part of each terminal pin 12 to which the bonding wires 13 are connected, protected by a molded resin 60. As the resin 60, normal resinous material for molding, such as an epoxy type resin, can be used.

According to this modification, in a pressure sensor, the connecting parts of the circuit chip 30 and the terminal pins 12 of the lead members are covered by the molded resin 60.

According to the first modification of the second embodiment, the circuit chip 30, the electrically connecting parts of the terminal pins 12 and the circuit chip 30 and each connecting part of the bonding wires 13 are protected in the opening portion 15 from the outside. Therefore, reliability and resistance to environmental changes of the pressure sensor 200 can be improved appropriately.

Figure 13:
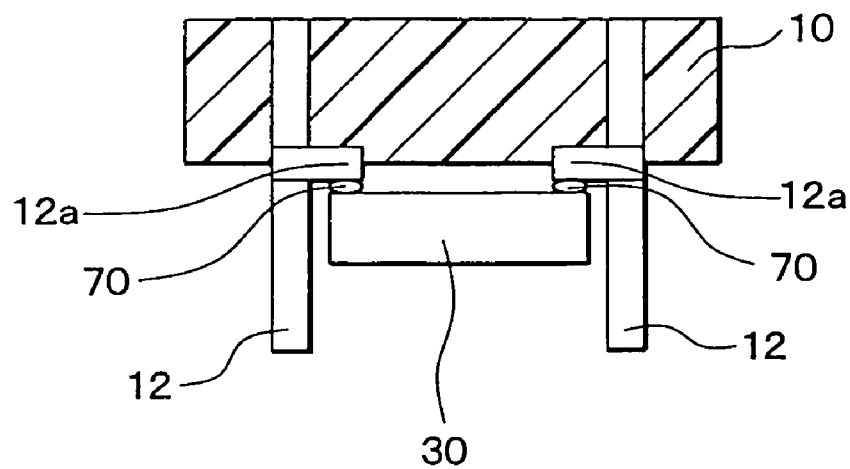
FIG. 13 is a schematic cross-sectional view showing a state wherein a circuit chip is provided in a second modification of the second embodiment.

FIG. 13 is a schematic cross-sectional view illustrating an arrangement of a circuit chip 30 in a second modification of the second embodiment. In FIG. 13, the circuit chip 30 is provided in the opening portion 15 in the connector case 10. The terminal pins 12 provided in the connector case 10 are connected with the circuit chip 30. However, in this modification, the circuit chip 30 is connected to the terminal pins 12 by a flip-chip bonding method.

In this modification shown in FIG. 13, the circuit chip 30 is electrically connected with the terminal pins 12 of the lead members by bumps 70. As the bumps 70, a normal bump material such as solder or gold (Au) can be used. The bumps 70 are connected to bending portions 12a of the terminal pins 12.

Figure 14:
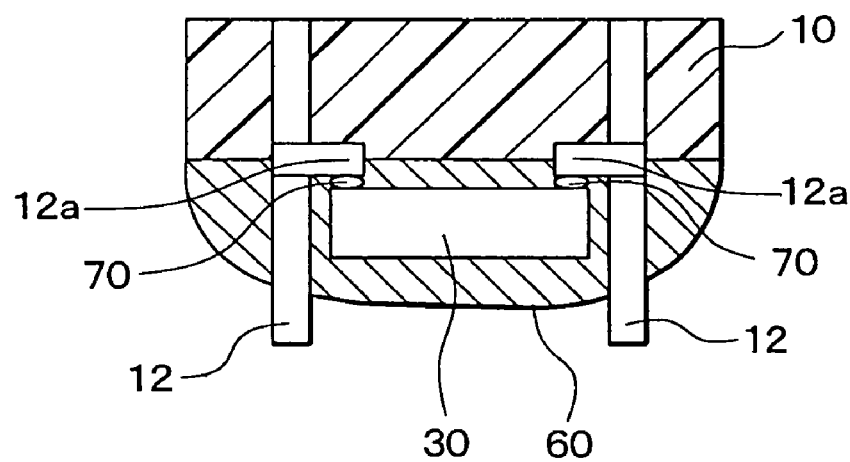
FIG. 14 is a schematic cross-sectional view showing a state wherein a circuit chip is provided in a third modification of the second embodiment.

FIG. 14 is a schematic cross-sectional view illustrating an arrangement of a circuit chip 30 in a third modification of the second embodiment. This is a further modification of the second modification.

Also in the arrangement shown in FIG. 14, the circuit chip 30 is electrically connected by the bumps 70 to the terminal pins 12 of the lead members. In this modification, the circuit chip 30, the bumps 70, and a part of each terminal pin connected with the bumps 70, are protected by the molded resin 60.

That is, according to the third modification, a pressure sensor wherein the circuit chip 30 and the connecting parts of the terminal pins 12 (the lead members) to the circuit chip 30 are covered by the molded resin 60, can be provided Therefore, according to the third modification of the second embodiment, the circuit chip 30, the connecting parts of the terminals pins 12 connected with the circuit chip 30 (the bumps 70) and each connecting part connected with the bumps 70 are protected from the outside. As a result, reliability and resistance to environmental changes of the pressure sensor 200 can be improved appropriately.

Figure 15:
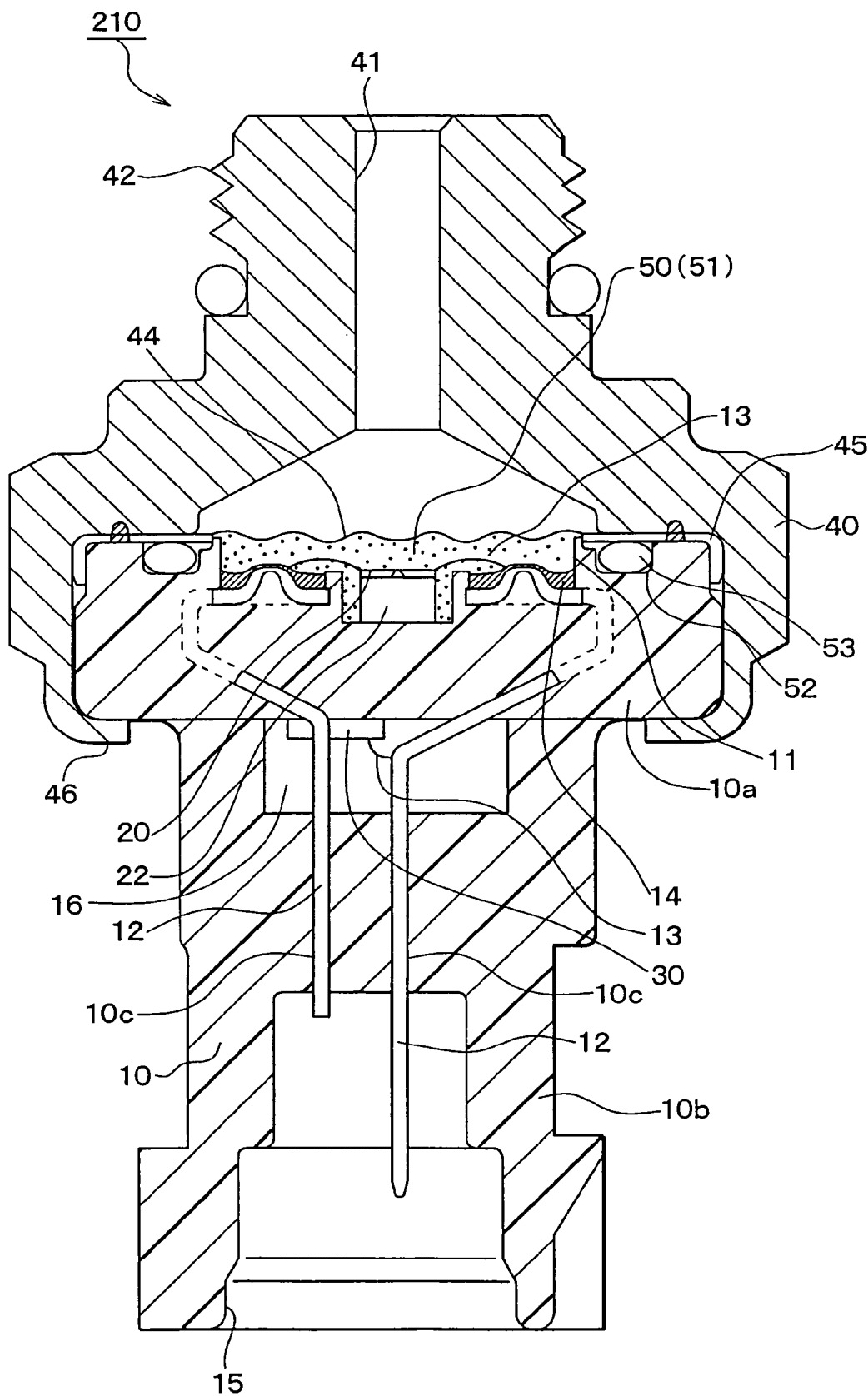
FIG. 15 is a schematic cross-sectional view showing a liquid-sealed diaphragm type pressure sensor in a fourth modification of the second preferred embodiment.

FIG. 15 is a cross-sectional view illustrating a liquid-sealed diaphragm type pressure sensor 210 according to a fourth modification of the second embodiment.

In this modification, the sensor chip 20 and the circuit chip 30 are formed independently, and the processing circuit 30a of the circuit chip 30 is formed in a place in the connector case 10, where the processing circuit 30a of the circuit chip 30 does not contact the oil 51, similarly to the pressure sensor 200 shown in FIG. 10.

In this modification shown in FIG. 15, the place of the connector case 10, where the circuit chip 30 is contained, is not the opening portion 15, but a cavity 16 formed in the connector case 10. The cavity 16 is a space separated from the opening portion 15.

The circuit chip 30 is provided in this cavity 16 and is electrically connected to the sensor chip 20 by the terminal pins 12 and the bonding wires 13. Here, the bonding wires 13 are used for the electrical connection, as an example. However, the bumps 70 shown in FIGS. 13 and 14 may be used for the electrical connection.

The cavity 16 is formed by dividing the connector case 10 into two parts. As shown in FIG. 15, the connector case 10 is divided at an area between the recess 11 and the opening portion 15.

To be more precise, the connector case 10 is constructed with a first casing 10a having the recess 11, and a second casing 10b having the cavity 16 and the opening portion 15. These casings 10a and 10b are joined integrally by a resinous welding or a resinous adhesive.

Here, the terminal pins 12 are insert-molded in the first casing 10a. The second casing 10b has through holes 10c extending from the opening portion 15a to the cavity 16, into which the terminal pins 12 are inserted.

The pressure sensor 210 according to this modification has an assembly structure between the first casing 10a and the second casing 10b. The circuit chip 30 is fixed to the first casing 10a, and the circuit chip 30 is electrically connected with the terminal pins 12 by the bonding wires 13 or the bumps 70. Then, the first casing 10a is joined to the second casing 10b.

The other parts of the pressure sensor 210 can be assembled similarly to the above-described embodiments. In this modification shown in FIG. 15, the circuit chip 30 and the connecting parts of the terminal pins 12 (the lead members) connected to the circuit chip 30 may be covered by the molded resin 60.

Here, in the modification shown in FIG. 15, the dividing area of the connector case 10 is provided in the vicinity of an end part of the fastening portion 46 of the housing 40. However, this dividing area of the connector case 10 can be provided in an intermediate part between the metal diaphragm 44 and the fastening portion 46.

When the dividing area of the connector case 10 is provided in the vicinity of the end part of the fastening portion 46, a fixing power from the fastening portion 46 works on the joining part of the casing 10a and the casing 10b thereby the joining strength between the casing 10a and the casing 10b is improved.

Other Embodiments

Although the present invention has been described in connection with some preferred embodiments thereof with reference to the accompanying drawings, it is to be noted that various changes and modifications will become apparent to those skilled in the art.

For example, the structure of the pressure sensor may be suitably changed only when the processing circuit 30a of the circuit chip 30 for processing signals transmitted from the sensor chip 20 is provided in a place in the connector case 10, where the processing circuit 30a can avoid the contact with the oil. Furthermore, the structures of the sensor chip 20 and the circuit chip 30 can be arbitrarily changed without being limited to the specific structures described above.

While the invention has been described with reference to preferred embodiments thereof, it is to be understood that the invention is not limited to the preferred embodiments and constructions. The invention is intended to cover various modification and equivalent arrangements. Other combinations and configuration are also within the spirit and scope of the invention.

What is claimed is:

1. A pressure sensor comprising:
   a connector case having a recess recessed from one surface;
   a sensor chip for detecting a pressure, which is contained in the recess;
   a circuit chip having a processing circuit for processing a signal from the sensor chip, the circuit chip being stacked with the sensor chip;
   an oil filled in the recess; and
   a metal diaphragm which closes and seals the recess filled with the oil, wherein:
   the processing circuit is arranged to avoid a contact with the oil,
   the sensor chip is fixed to the processing circuit through an adhesive material,
   the adhesive material is arranged to include a region where the processing circuit is placed, and
   the processing circuit is fully covered by at least a part of the sensor chip stacked therewith.

2. The pressure sensor according to claim 1, wherein the circuit chip is arranged on a bottom wall surface of the recess, and the sensor chip is located above the circuit chip.

3. The pressure sensor according to claim 2, further comprising:
   a conductive connecting member having an electric conductivity, through which the sensor chip and the circuit chip are connected; and
   a ground pad with a ground potential, wherein:
   the ground pad is formed on the circuit chip, and the ground pad and the conductive connecting member are electrically connected.

4. The pressure sensor according to claim 2, further comprising an adhesive layer fixing the bottom wall surface to the circuit chip.

5. The pressure sensor according to claim 1, wherein the sensor chip is stacked with the circuit chip through a glass pedestal.

6. The pressure sensor according to claim 1, wherein the sensor chip and the circuit chip are electrically connected by a bonding wire.

7. The pressure sensor according to claim 1, wherein the region is positioned in a center area of a surface of the circuit chip and spaced apart from a periphery of the circuit chip.

8. A pressure sensor comprising:
   a connector case having a recess recessed from one surface;
   a sensor chip for detecting a pressure, located in the recess;
   an oil filled in the recess;
   a metal diaphragm which closes and seals the recess filled with the oil;
   a circuit chip having a processing circuit for processing a signal from the sensor chip; and
   a terminal pin, provided in the connector case, through which the processing circuit is electrically connected to an exterior, wherein:
   the circuit chip is located in the connector case at a position separated from the recess;
   the sensor chip is electrically connected to the circuit chip through the terminal pin;
   the connector case has an opening portion at a side opposite to the recess;
   the terminal pin is exposed in the opening portion to be connectable to the exterior; and
   the circuit chip is located in the opening portion.

9. The pressure sensor according to claim 8, wherein the circuit chip is electrically connected with the terminal pin by a bonding wire.

10. The pressure sensor according to claim 8, wherein the circuit chip is electrically connected with the terminal pin by a bump.

11. The pressure sensor according to claim 8, wherein the circuit chip and a connecting part for connecting the circuit chip with the terminal pin are covered by a resin member.

12. A pressure sensor comprising:
    a connector case having a recess recessed from one surface;
    a sensor chip for detecting a pressure, located in the recess;
    an oil filled in the recess;
    a metal diaphragm which closes and seals the recess filled with the oil;
    a circuit chip having a processing circuit for processing a signal from the sensor chip; and
    a terminal pin, provided in the connector case, through which the processing circuit is electrically connected to an exterior, wherein:
    the circuit chip is located in the connector case at a position separated from the recess; and
    the sensor chip is electrically connected to the circuit chip through the terminal pin;
    the connector case has an opening portion at a side opposite to the recess;
    the terminal pin is exposed in the opening portion to be connectable to the exterior; and
    the circuit chip is located in a space of the connector case, separated from the recess and the opening portion.

13. The pressure sensor according to claim 12, wherein the circuit chip is electrically connected with the terminal pin by a bonding wire.

14. The pressure sensor according to claim 12, wherein the circuit chip is electrically connected with the terminal pin by a bump.

15. The pressure sensor according to claim 12, wherein the circuit chip and a connecting pert for connecting the circuit chip with the terminal pin are covered by a resin member.

* * * * *